US008419918B2

(12) United States Patent
Hong et al.

(10) Patent No.: US 8,419,918 B2
(45) Date of Patent: Apr. 16, 2013

(54) METHOD OF SURFACE MODIFICATION OF POLYIMIDE FILM USING ETHYLENEIMINES COUPLING AGENT, MANUFACTURING METHOD OF FLEXIBLE COPPER CLAD LAMINATE AND ITS PRODUCT THEREBY

(75) Inventors: Young-Taik Hong, Daejun (KR); Hyung Dae Kang, Daejun (KR); Seog Je Kim, Daejun (KR); Jae Heung Lee, Daejun (KR)

(73) Assignee: Korea Research Institute of Chemical Technology, Yusung-gu, Daejun (KR)

( * ) Notice: Subject to any disclaimer, the term of this patent is extended or adjusted under 35 U.S.C. 154(b) by 1156 days.

(21) Appl. No.: 11/920,492

(22) PCT Filed: May 18, 2006

(86) PCT No.: PCT/KR2006/001853
§ 371 (c)(1),
(2), (4) Date: Dec. 31, 2007

(87) PCT Pub. No.: WO2006/129922
PCT Pub. Date: Dec. 7, 2006

(65) Prior Publication Data
US 2009/0023010 A1    Jan. 22, 2009

(30) Foreign Application Priority Data
May 30, 2005 (KR) .................. 10-2005-0045510

(51) Int. Cl.
C25D 5/56      (2006.01)
C25D 5/34      (2006.01)
C23C 28/02     (2006.01)
(52) U.S. Cl.
USPC ........................... 205/165; 205/186; 205/210
(58) Field of Classification Search .................. 205/165, 205/186, 210
See application file for complete search history.

(56) References Cited

U.S. PATENT DOCUMENTS
6,194,076 B1 *  2/2001  Matienzo et al. ............. 428/458
6,420,258 B1 *  7/2002  Chen et al. .................... 438/622
(Continued)

FOREIGN PATENT DOCUMENTS
JP    08034869         2/1996
JP    09003221         1/1997
JP    11029852         2/1999
JP    2002004067       1/2002
JP    2004123895 A *   4/2004
(Continued)

OTHER PUBLICATIONS
Zhu et al., "Immobilization of Poly(ethylene imine) onto Polymer Films Pretreated with Plasma", J. of Appl. Polymer Sci. (no month, 2000), vol. 75, pp. 576-582.*

Primary Examiner — Edna Wong
(74) Attorney, Agent, or Firm — D. Peter Hochberg; Sean F. Mellino; Daniel J. Smola

(57) ABSTRACT

A method of surface modifying a polyimide film, a method of manufacturing a flexible copper clad laminate using the same, and a flexible copper clad laminate (FCCL) having a two-layer structure manufactured thereby. The method of surface modifying a polyimide film is conducted by modifying the surface of a polyimide film through a first plasma treatment, dipping the polyimide film into a solution containing an ethyleneimine-based silane coupling agent prepared by mixing the compound of Formula 1 and the compound of Formula 2 at a molar ratio of with 0.25~1, and then modifying the surface of the polyimide film through a second plasma treatment. The method of surface modifying a polyimide film is advantageous because it may be substituted for a conventional surface treatment processes using ion beams. Also, the FCCL having a two-layer structure, formed by conducting copper sputtering and electroplating on the surface modified polyimide film, has good adhesive strength between the polyimide film and the copper foil and can maintain such adhesive strength even at high temperatures for a long period of time. Further, it may be usefully applied to electronic parts, such as flexible printed circuit boards, TCP (Tape Carrier Package), COF (Chip On Film), etc.

4 Claims, 8 Drawing Sheets

U.S. PATENT DOCUMENTS

| | | | |
|---|---|---|---|
| 6,472,080 B1 * | 10/2002 | Inagaki et al. | 428/450 |
| 6,767,644 B2 * | 7/2004 | Aida | 428/473.5 |
| 2005/0236711 A1 * | 10/2005 | Wang et al. | 257/751 |

FOREIGN PATENT DOCUMENTS

| | | |
|---|---|---|
| WO | WO 2004/050352 | 6/2004 |

\* cited by examiner

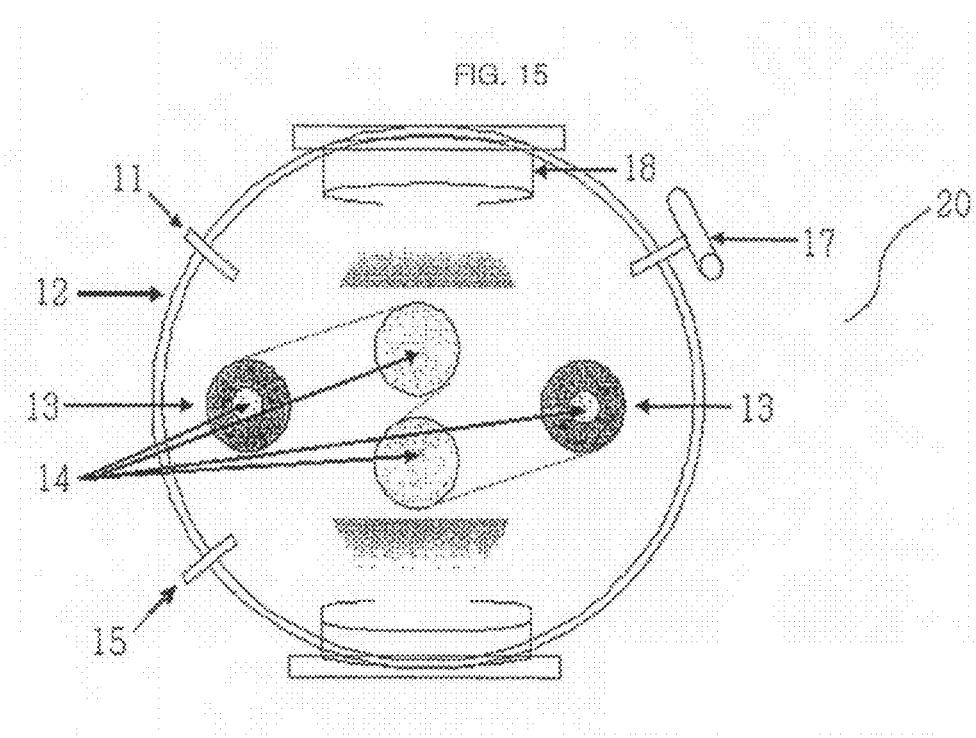

METHOD OF SURFACE MODIFICATION OF POLYIMIDE FILM USING ETHYLENEIMINES COUPLING AGENT, MANUFACTURING METHOD OF FLEXIBLE COPPER CLAD LAMINATE AND ITS PRODUCT THEREBY

CROSS-REFERENCE TO RELATED APPLICATIONS

This application is a National Stage application of International Application No. PCT/KR2006/001853, filed on May 18, 2006, which claims priority of Korean application number 10-2005-0045510, filed on May 30, 2005.

BACKGROUND OF THE INVENTION

1. Technical Field

The present invention relates to a method of surface modifying a polyimide film, a method of manufacturing a flexible copper clad laminate (FCCL) using the same, and a FCCL having a two-layer structure manufactured thereby. More particularly, the present invention relates to a method of surface modifying a polyimide film, comprising modifying the surface of a polyimide film through first plasma treatment, dipping the polyimide film into a solution containing an ethyleneimine-based silane coupling agent, and then modifying the surface of the polyimide film through second plasma treatment, a polyimide FCCL having a two-layer structure using the method of modifying the surface of a polyimide film, and to a polyimide FCCL having excellent adhesive strength manufactured using the manufacturing method.

2. Description of the Prior Art

A polyimide film has heat resistance, electrical properties, chemical resistance, and bending resistance that are superior to other polymer materials, and thus may be variously used as insulating substrate material for electronic parts, such as a flexible printed circuit board (FPCB), tape automated bonding (TAB), COF (Chip On Film), etc. A conventional FCCL (Flexible Copper Clad Laminate) used in an FPCB is exemplified by a FCCL having a three-layer structure using an epoxy adhesive. However, such a FCCL has deteriorated dimensional stability because the heat resistance of the adhesive is poor. Hence, the conventional FCCL has been deemed unsuitable for fine patterning.

Recently, thorough attempts have been made to replace a conventional product having a three-layer structure with a product having a two-layer structure. The product having a two-layer structure is realized by directly die-casting a polyimide film to a copper foil or bonding a polyimide film to a copper foil at a high temperature without the need for an adhesive layer, and therefore, provides advantages such as easy formation of fine patterns and high flexibility. Moreover, by virtue of the above-mentioned advantages, a FCCL having a two-layer structure may be more widely marketable for use in display products, such as folding mobile phones, LCDs, PDP modules, etc.

In particular, since Korea mainly imports substrate materials for use in electronic parts, the development of a two-layered FCCL using a novel process has been urgently required.

A method of manufacturing a two-layered FCCL by laminating a polyimide film and a copper foil, rather than using an adhesive, has been reported.

In addition, sputtering-electroplating methods have been proposed, in which a thin metal seed layer (nickel, chromium, etc.) is formed through sputtering, and then a copper layer is formed to a desired thickness through electroplating thereon. However, the above method suffers because the surface modification of the polyimide film should be preceded using plasma or ion beams, during which a specific seed layer is needed. Particularly, when a double-sided FCCL is manufactured, specific equipment is needed, thus the manufacturing coat becomes increased. Further, since the adhesive strength of the FCCL becomes poor under conditions of high temperature and high humidity, reliability is decreased. Furthermore, a drilling process, which is conducted after a printed circuit board is manufactured, may cause environmental contamination.

Leading to the present invention, intensive and thorough effort to obtain two-layered FCCLs, carried out by the present inventors, aiming to avoid the problems encountered in the related art, led to the development of a method of manufacturing a FCCL having a two-layer structure, comprising modifying the surface of a polyimide film through first plasma treatment, dipping into a solution containing a predetermined ethyleneimine-based silane coupling agent for surface treatment and then second plasma treatment, and sequentially copper sputtering and electroplating the surface modified polyimide film under optimal conditions, thus the single-sided or double-sided FCCL can be used for fine wiring process by directly laminating copper to the polyimide film, and can maintain good adhesive strength between the film and the copper foil even at high temperatures for a long period of time.

SUMMARY OF THE PRESENT INVENTION

Disclosure Of Invention

Technical Problem

An object of the present invention is to provide a method of surface modifying a polyimide film.

Another object of the present invention is to provide a method of manufacturing a FCCL having a two-layer structure using the method of surface modifying a polyimide film and thus a single-sided or double-sided FCCL having a two-layer structure manufactured thereby.

A further object of the present invention is to provide an ethyleneimine-based silane coupling agent suitable for surface modifying the polyimide film.

Technical Solution

In order to achieve the above objects, the present invention provides a method of surface modifying a polyimide film, comprising 1) modifying the surface of a polyimide film through a first plasma treatment; 2) dipping the polyimide film into a solution containing an ethyleneimine-based silane coupling agent, which is prepared by reacting the compound represented by Formula 1 below and the compound represented by Formula 2 below with a molar ratio of 1:0.25~1 to treat the surface thereof; and 3) modifying the surface of the polyimide film through a second plasma treatment:

Formula 1

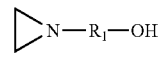

Formula 2

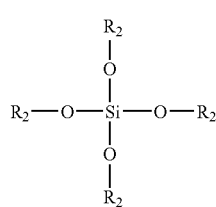

wherein, $R_1$ and $R_2$ are each hydrogen, a $C_1$~$C_{10}$ alkyl group, or a vinyl group.

The solution may contain 0.01~10 wt % of ethyleneimine-based silane coupling agent, and may be prepared by dissolving the ethyleneimine-based silane coupling agent in any one or a combination of solvents selected from the group consisting of water, acetone, methanol, ethanol, and isopropanol.

As such, the polyimide film may be dipped into the solution for 1~60 min.

The plasma treatment may be conducted at 20~100 W under pressure in a vacuum chamber of $1 \times 10^{-3}$~$1 \times 10^{-5}$ torr for 10~1,000 seconds using a direct current or 60 Hz high-frequency power source.

In addition, the present invention provides a method of manufacturing a FCCL using the method of surface modifying the polyimide film mentioned above. More particularly, the surface modified polyimide film may be subjected to copper sputtering on either or both surfaces thereof at 0.5~30 mA and 50~500 W for 1~10 hours, thus forming a copper sputtering layer, which is then subjected to electroplating, thus forming a copper electroplating layer.

The copper sputtering layer may have a thickness of 500~5,000 Å, and the copper electroplating layer may have a thickness of 1~50 μm.

In addition, the present invention provides a polyimide FCCL having a two-layer structure, comprising a 500~5,000 Å thick copper sputtering layer formed on either surface of a polyimide film modified using the above surface modification method and a 1~50 μm thick copper electroplating layer formed on the copper sputtering layer.

In addition, the present invention provides a polyimide FCCL having a two-layer structure, comprising a 500~5,000 Å thick copper sputtering layer formed on each of both surfaces of a polyimide film modified using the above surface modification method and a 1~50 μm thick copper electroplating layer formed on the copper sputtering layer.

In addition, the present invention provides an ethyleneimine-based silane coupling agent, which is prepared by mixing the compound represented by Formula 1 and the compound represented by Formula 2 with a molar ratio of 1:0.25~1, and then allowing them to react at 50~100° C. for 1~5 hours.

Advantageous Effects

According to the present invention, the method of surface modifying a polyimide film is advantageous because it may be substituted for a conventional surface treatment processes using ion beams, without the need of a specific seed layer, therefore decreasing the cost and reducing environmental contamination due to the use of heavy metals.

In addition, the FCCL having a two-layer structure of the present invention has good adhesive strength between the polyimide film and the copper foil and can maintain it even at high temperatures for a long period of time, and thus is suitable for use in substrate materials of electronic parts, such as flexible printed circuit board, TCP (Tape Carrier Package), COF (Chip On Film), etc.

BRIEF DESCRIPTION OF THE DRAWINGS

FIG. 15 is a schematic view showing a pulse DC sputtering device used in the present invention.

DETAILED DESCRIPTION OF THE PRESENT INVENTION

[Best Mode]

Figure 1:
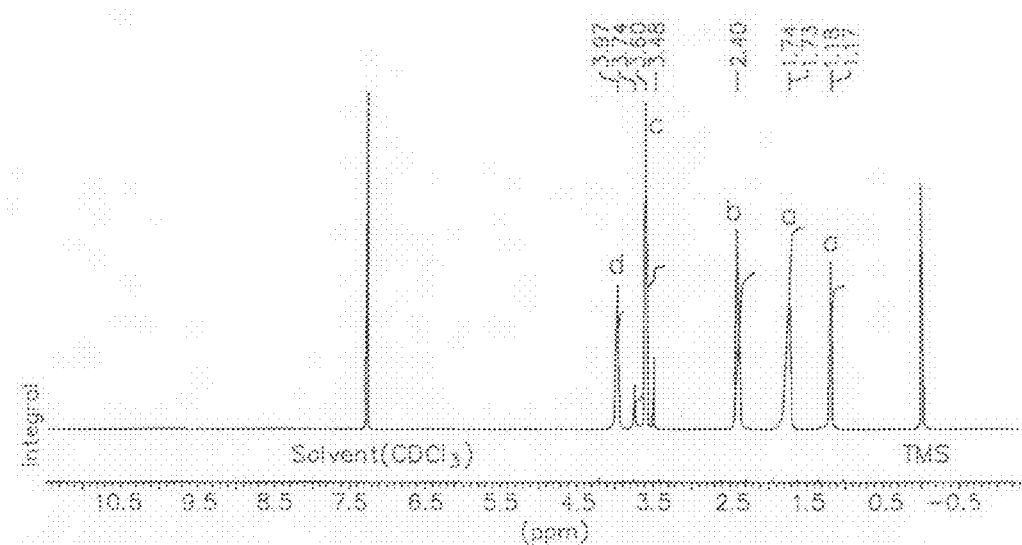
FIG. 1 is a $^1$H-NMR spectrum of the ethyleneimine-based silane coupling agent used in Example 1 of the present invention.

Hereinafter, a detailed description will be given of the present invention.

In order to provide a polyimide FCCL having improved adhesion, the present invention provides a method of surface modifying a polyimide film, which comprises 1) modifying the surface of a polyimide film through first plasma treatment, 2) dipping the polyimide film into a solution containing an ethyleneimine-based silane coupling agent, which is prepared by mixing the compound represented by Formula 1 below and the compound represented by Formula 2 below with a molar ratio of 1:0.25~1, for surface treatment, and 3) modifying the surface of the polyimide film through second plasma treatment:

Formula 1

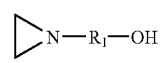

Formula 2

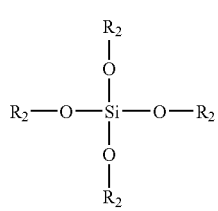

wherein $R_1$ and $R_2$ are defined as above.

Examples of the polyimide film usable in the present invention include, but are not limited to, synthetic or commercially available ones, as long as the polyimide film has a thickness of 10~100 μm. Preferably, the polyimide film is exemplified by Kapton H or Kapton E, available from Dupont Co. Ltd., USA, Upilex-S, available from Ube Co. Ltd., Japan, or Apical film, available from Kaneka Co. Ltd., Japan.

In the surface modification method of the polyimide film of the present invention, the first plasma treatment is a process of supplying a hydrophilic group to the surface of the polyimide film. The plasma treatment is preferably conducted using argon, oxygen or nitrogen alone, or a gas mixture of argon and oxygen, of argon and nitrogen or of nitrogen and oxygen mixed with an appropriate ratio. The appropriate ratio of the gas mixture is 0.5~20 cc/min.

The plasma treatment is carried out at 20~100 W under pressure in a vacuum chamber of $1 \times 10^{-3} \sim 1 \times 10^{-5}$ torr for 10~1,000 seconds using a direct current or 60 Hz high-frequency power source. When the polyimide film is treated with plasma at a high power for a long period of time in a gas atmosphere including excess oxygen, nitrogen or argon, the surface of the polyimide film may suffer enormous damage, such as carbonization, undesirably deteriorating the inherent properties of the polyimide film. Consequently, it is impossible to use the polyimide film as insulating material for a substrate.

In the surface modification method of the polyimide film of the present invention, the dipping of the polyimide film into the solution containing the ethyleneimine-based silane coupling agent for surface treatment functions to induce a graft reaction between the hydrophilic group supplied to the surface of the polyimide film through the first plasma treatment and the solution containing the ethyleneimine-based silane coupling agent, in order to assure high adhesive strength between the polyimide film and a copper foil to be subsequently formed.

The ethyleneimine-based silane coupling agent of the present invention is prepared by mixing the compound of Formula 1 and the compound of Formula 2 with molar ratio of 1:0.25~1, allowing them to react at 50~100° C. for 1~5 hours, and then reflux removing undesirably produced methanol.

FIG. 1 is the $^1$H-NMR spectrum of the ethyleneimine-based silane coupling agent used in Example 1 of the present invention. As is apparent from these results, the synthesis of the ethyleneimine-based silane coupling agent of the present invention can be confirmed through analysis of the integration ratio of protons.

The ethyleneimine-based silane coupling agent is dissolved in an organic solvent or water or a solvent mixture thereof in a concentration of 0.01~10 wt % to prepare desired a solution, into which the polyimide film is then dipped. As such, the solvent used in the preparation of the solution containing the ethyleneimine-based silane coupling agent is not particularly limited, but preferably includes any one or a combination of solvents selected from the group consisting of water, acetone, methanol, ethanol, and isopropanol, each of which has a low boiling point.

The dipping process is preferably conducted for 1~60 minutes. A dipping time shorter than 1 minute results in an insufficiently induced reaction of the ethyleneimine-based silane coupling agent. Conversely, when the dipping time exceeds 60 minutes, adhesion and heat resistance do not further increase in proportion to the reaction time.

Figure 2:
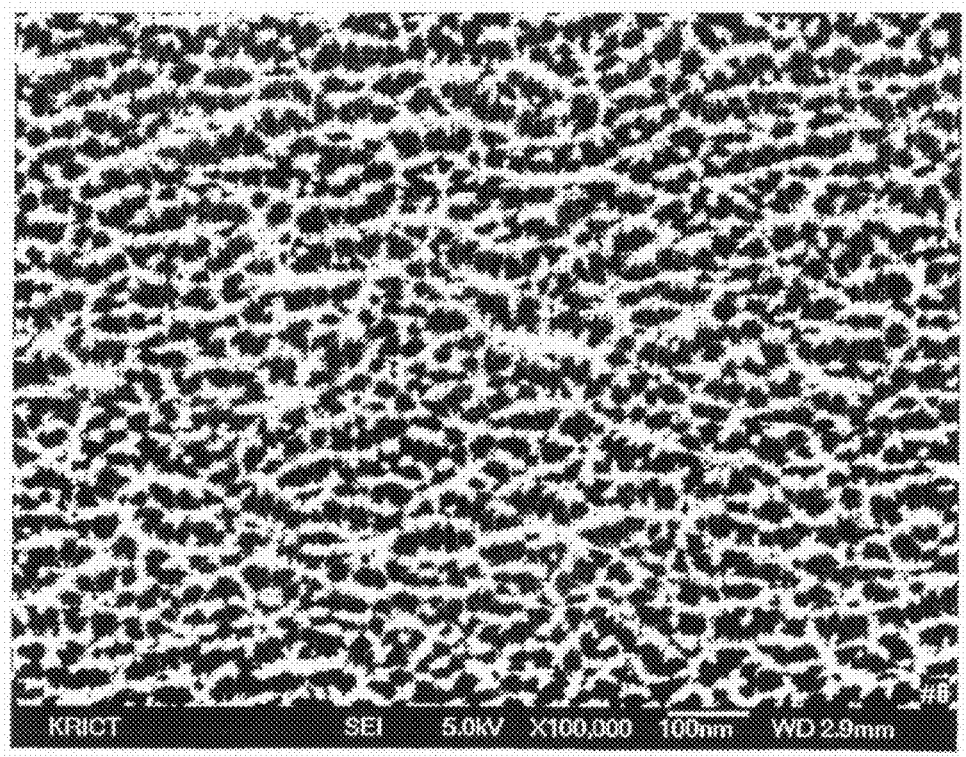
FIG. 2 is a SEM (Scanning Electron Micrograph) of the polyimide film of Example 1 of the present invention.
Figure 3:
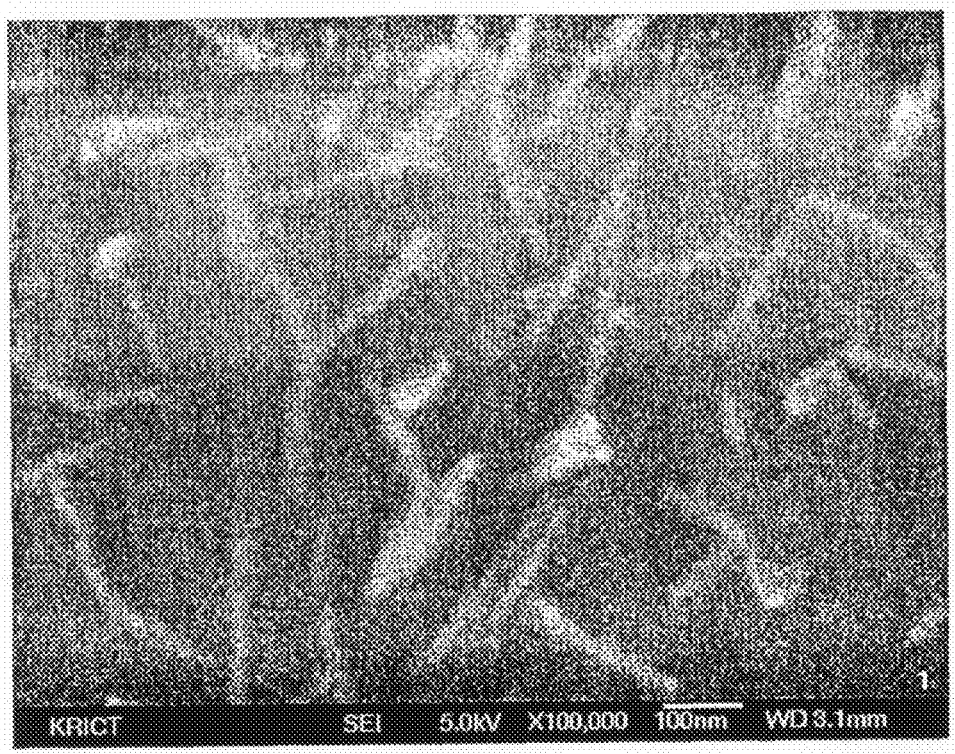
FIG. 3 is an SEM of the polyimide film of Comparative Example 1 of the present invention.
Figure 4:
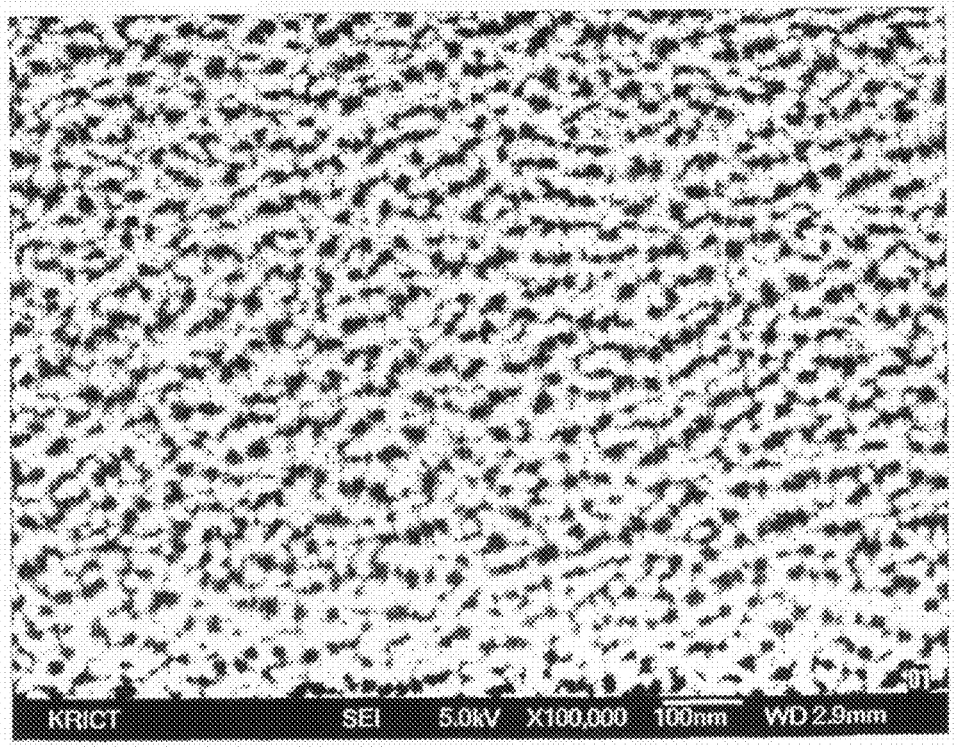
FIG. 4 is an SEM of the polyimide film of Comparative Example 2 of the present invention.
Figure 5:
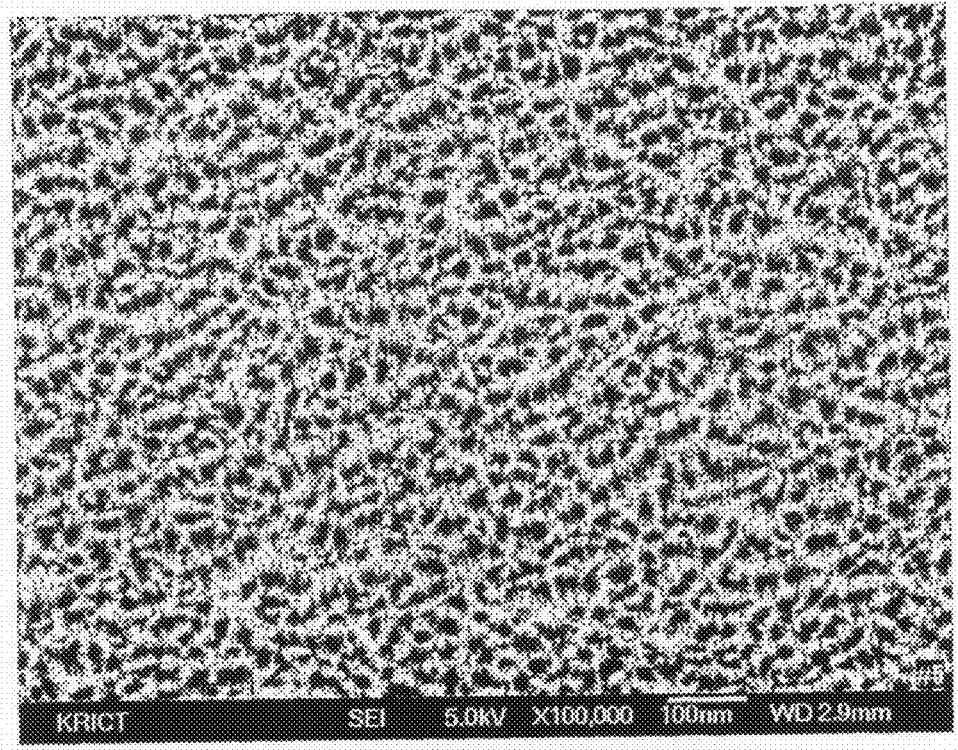
FIG. 5 is an SEM of the polyimide film of Comparative Example 3 of the present invention.

FIGS. 2 to 5 are SEMs showing the surfaces of the polyimide films prepared in Example 1 and Comparative Examples 1 to 3. FIG. 2 illustrates the surface of the polyimide film of Example 1, FIG. 3 illustrates the surface of the polyimide film of Comparative Example 1, FIG. 4 illustrates the surface of the polyimide film of Comparative Example 2, and FIG. 5 illustrates the surface of the polyimide film of Comparative Example 3. From the results shown in these drawings, the polyimide film of Example 1, which is surface treated using the method of the present invention, can be seen to have a predetermined shape, unlike the polyimide films of Comparative Examples 1 to 3.

Figure 6:
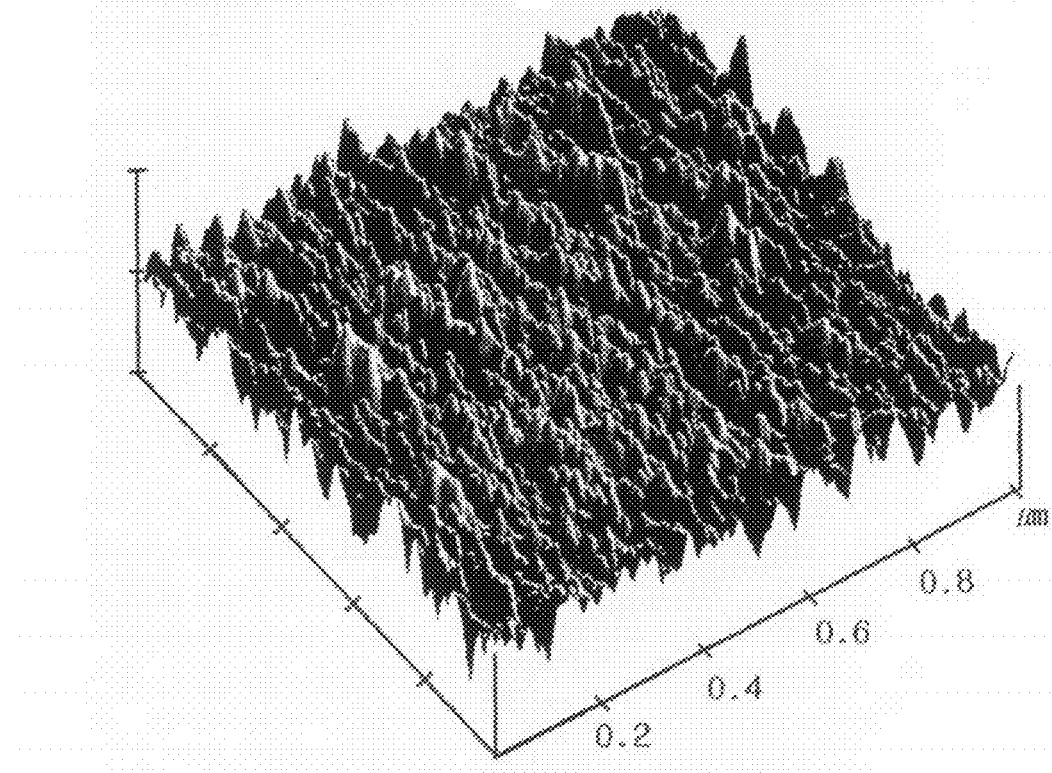
FIG. 6 is an AFM (Atomic Force Microscopy) image of the polyimide film of Example 1 of the present invention.
Figure 7:
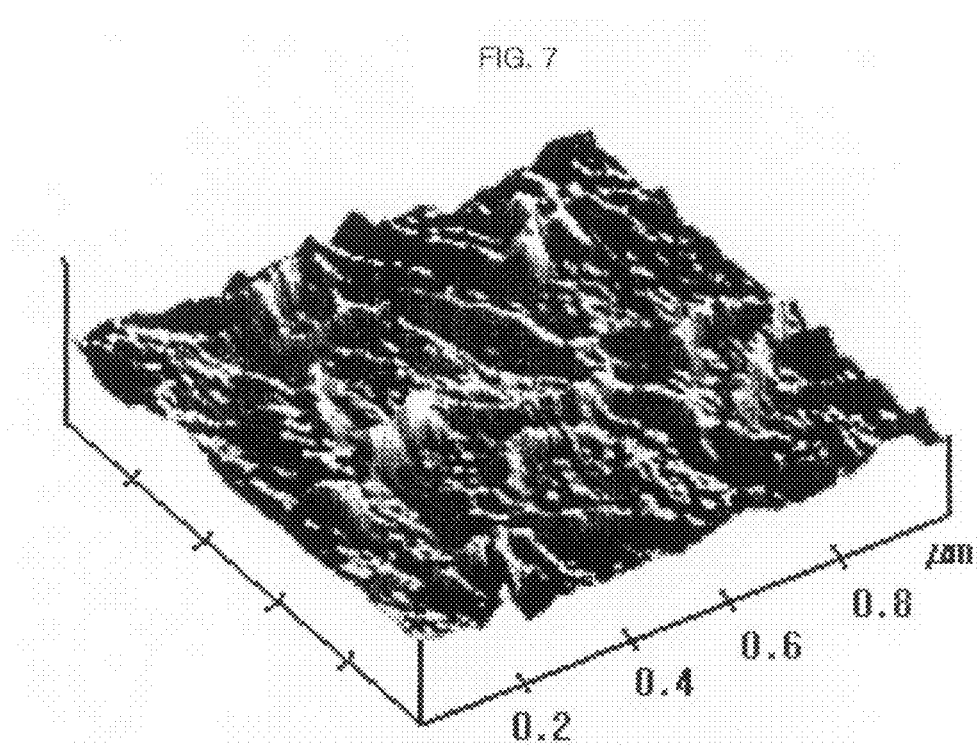
FIG. 7 is an AFM image of the polyimide film of Comparative Example 1 of the present invention.
Figure 8:
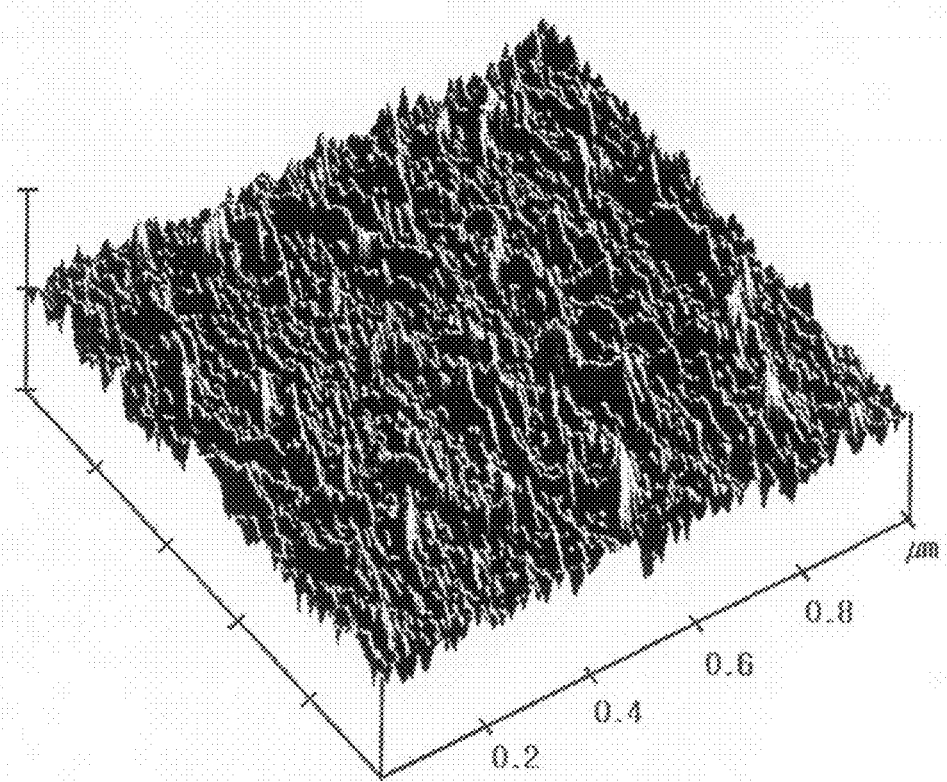
FIG. 8 is an AFM image of the polyimide film of Comparative Example 2 of the present invention.
Figure 9:
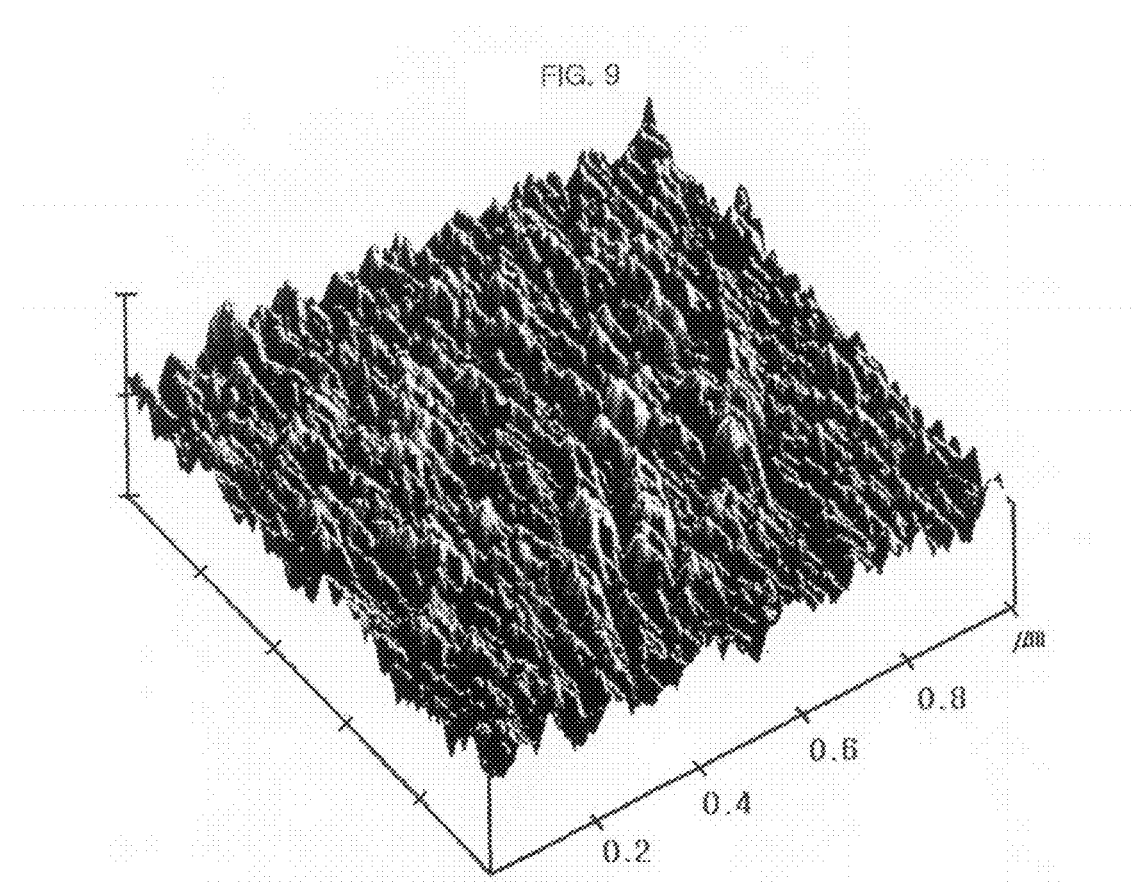
FIG. 9 is an AFM image of the polyimide film of Comparative Example 3 of the present invention.

FIGS. 6 to 9 are AFM images showing the surfaces of the polyimide films prepared in Example 1 and Comparative Examples 1 to 3. FIG. 6 illustrates the surface of the polyimide film of Example 1, FIG. 7 illustrates the surface of the polyimide film of Comparative Example 1, FIG. 8 illustrates the surface of the polyimide film of Comparative Example 2, and FIG. 9 illustrates the surface of the polyimide film of Comparative Example 3. From the results shown in these drawings, the polyimide film of Example 1, which is surface treated using the method of the present invention, can be seen to have very small protrusions formed thereon.

Figure 10:
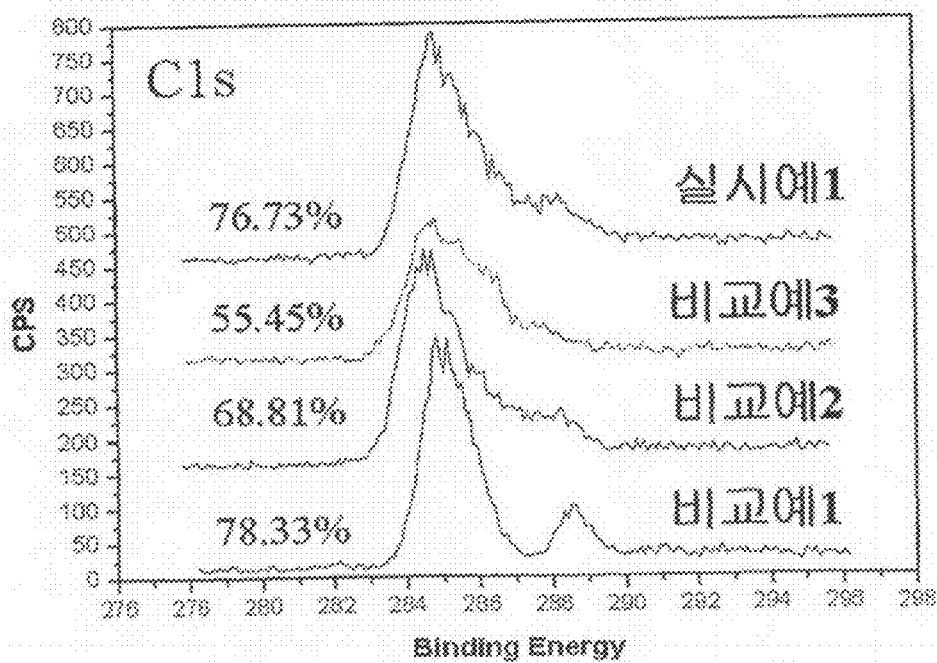
FIG. 10 is the carbon atomic ratio of the polyimide film of the present invention determined using ESCA (Electron Spectroscopy of Chemical Analysis)
Figure 11:
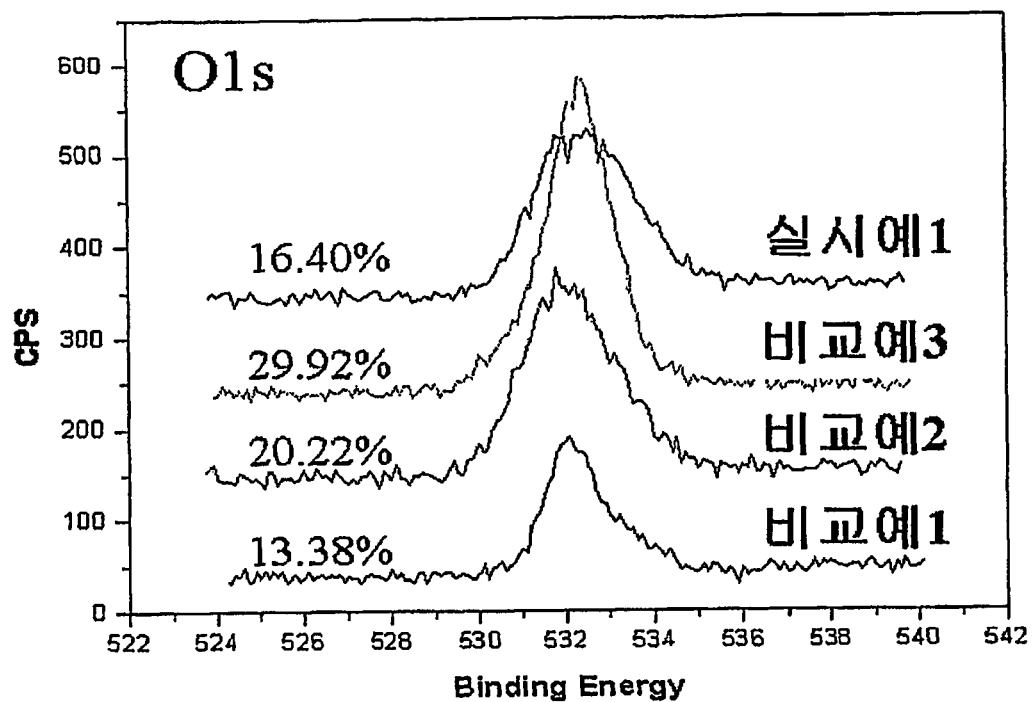
FIG. 11 is the oxygen atomic ratio on the polyimide film of the present invention determined using ESCA.
Figure 12:
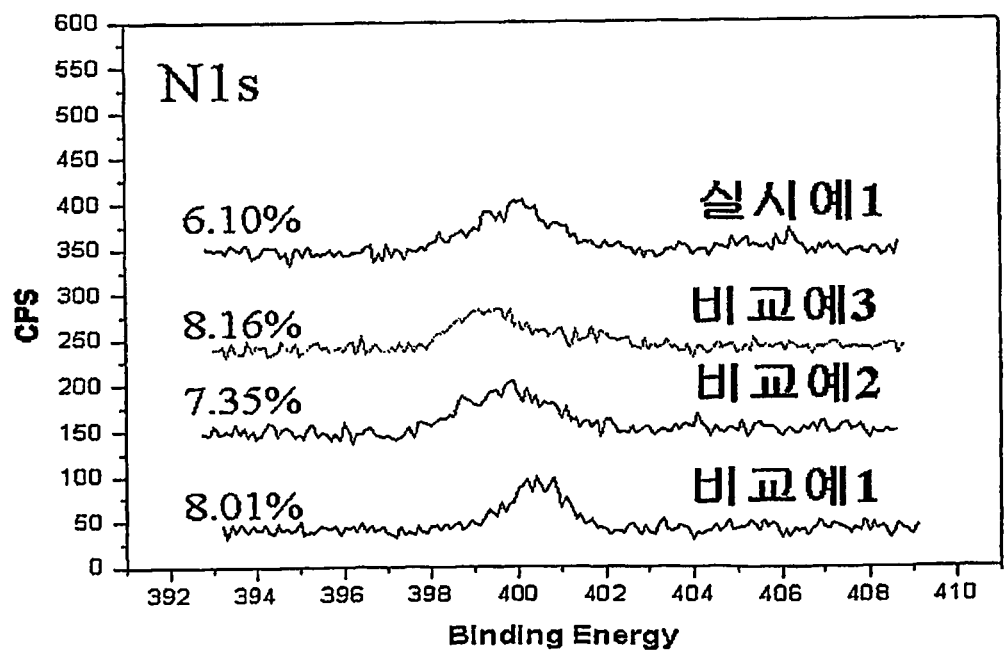
FIG. 12 is the nitrogen atomic ratio on the polyimide film of the present invention determined using ESCA.
Figure 13:
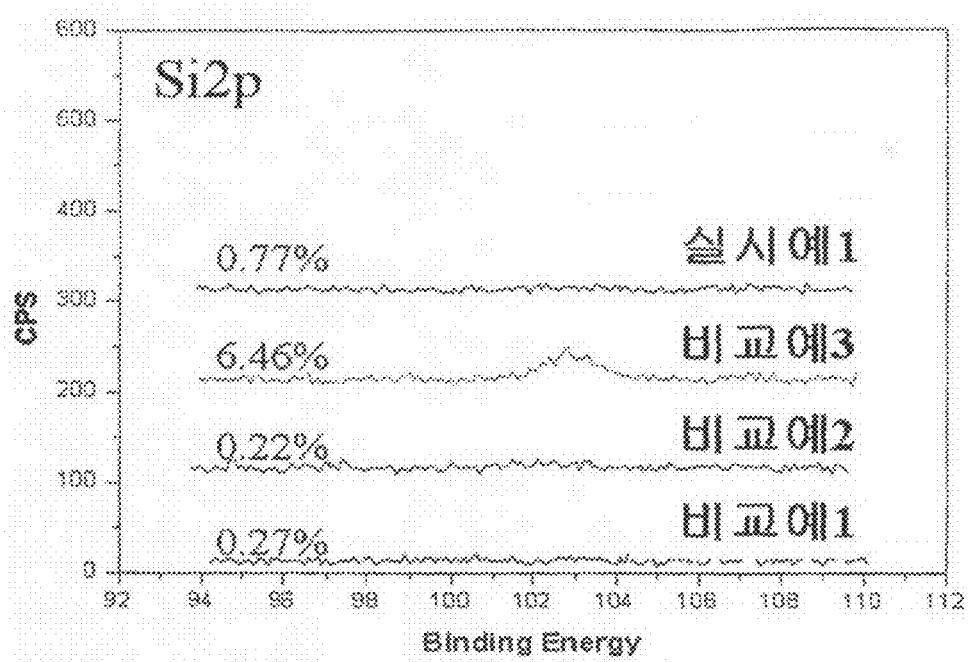
FIG. 13 is the silicon atomic ratio on the polyimide film of the present invention determined using ESCA.

FIGS. 10 to 13 illustrate the results of ESCA of the polyimide films prepared in Example 1 and Comparative Examples 1 to 3. FIG. 10 shows the carbon atomic ratio, FIG. 11 shows the oxygen atomic ratio, FIG. 12 shows the nitrogen atomic ratio, and FIG. 13 shows the silicon atomic ratio. As such, the polyimide film of Example 1, which is treated using the surface modification method of the present invention, is seen to have an oxygen content much lower than that of the polyimide film of Comparative Example 3. However, the polyimide film of the present invention can be confirmed to have good adhesion due to molecular recombination caused by plasma polymerization upon the plasma treatment.

After the dipping process at 50~100° C. for 1~60 minutes, the surface modified polyimide film is washed with distilled water and alcohol to remove unreacted solution, and the surface thereof is then sufficiently dried in an oven at 100° C. or lower before subsequent processes.

As for the surface modification method of the polyimide film of the present invention, the second plasma treatment functions to realize the molecular recombination of the ethyleneimine-based silane coupling agent on the surface of the polyimide film, the molecular recombination varying depending on the plasma conditions.

In this case, the second plasma treatment is conducted in the same manner as in the first plasma treatment.

Figure 14:
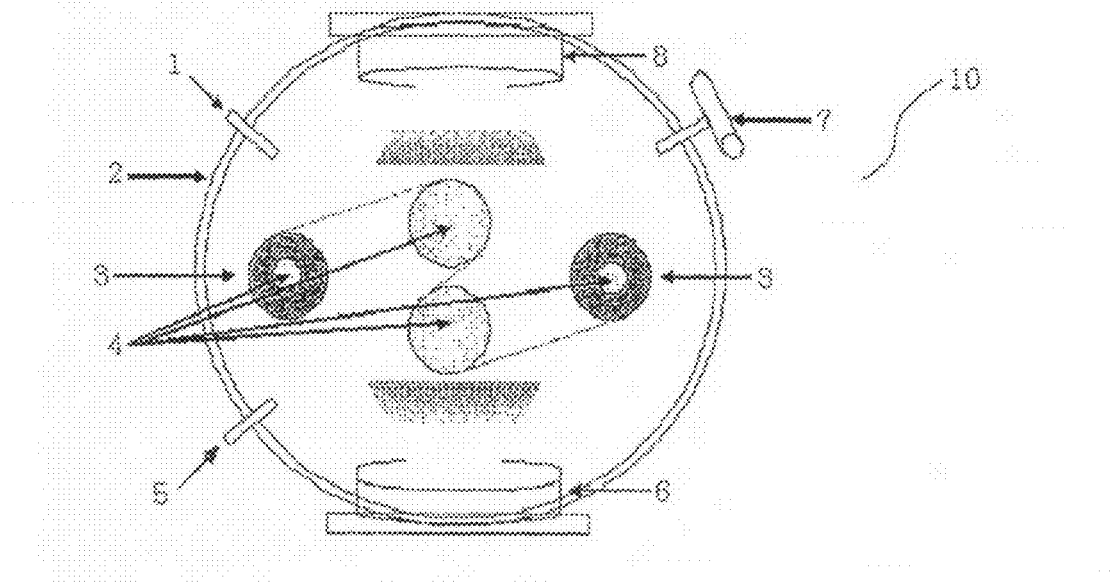
FIG. 14 is a schematic view showing a plasma device used in the present invention.

FIG. 14 schematically illustrates the plasma device 10 of the present invention. While a polyimide film 3 is wound on rollers 4, argon gas, oxygen gas or a gas mixture of argon and oxygen is supplied in an amount of 3~20 sccm into a vacuum chamber 2 maintained at $1 \times 10^{-3} \sim 1 \times 10^{-5}$ torr through inlets 1, 5 thereof to form a plasma treatment atmosphere. Subsequently, plasma treatment is conducted using plasma sources 6, 8 held at upper and lower portions of the vacuum chamber 2 under conditions of current of 1~100 mA and voltage of 0.25~10 KV.

That is, according to the surface modification method of the polyimide film of the present invention, the surface of the polyimide film is subjected to first plasma treatment to introduce the hydrophilic group onto the surface of the film, after which the surface treated polyimide film is dipped into the solution containing the ethyleneimine-based silane coupling agent to induce a graft reaction between the hydrophilic group formed on the surface of the polyimide film and the solution containing the ethyleneimine-based silane coupling agent so as to increase adhesion between the polyimide film and the copper foil. Subsequently, the polyimide film is subjected to second plasma treatment, such that molecular recombination of the ethyleneimine-based silane coupling agent takes place on the polyimide film through plasma polymerization. As such, the molecular recombination results in high adhesive strength of 0.7 kg/cm or more.

In addition, the present invention provides a method of manufacturing a FCCL using the surface modification method of the polyimide film mentioned above. Specifically, the manufacturing method of the present invention comprises:
1) modifying the surface of a polyimide film by dipping a polyimide film into a solution containing an ethyleneimine-based silane coupling agent;
2) washing and drying the surface modified polyimide film;
3) copper sputtering either or both surfaces of the dried polyimide film at 0.5~30 mA and 50~500 W for 1~10 hours to form a copper sputtering layer; and
4) electroplating the copper sputtering layer to form a copper electroplating layer.

In the step 1), the surface modification process of the polyimide film used in the present step is mentioned as above, in which the polyimide film is first-treated with plasma to supply a hydrophilic group to the surface thereof, is dipped into the solution containing the ethyleneimine-based silane coupling agent for surface treatment to induce a graft reaction so as to increase adhesion between the polyimide film and the copper foil, and is then second-treated with plasma such that molecular recombination takes place on the film. The preferred dipping process for modifying the surface of the polyimide film is conducted at 50~100° C. Further, although the dipping time may vary with the temperature, it is preferably in the range of 1~60 min.

In the step 2), the polyimide film modified in the previous step is washed with distilled water and alcohol to remove unreacted solution and is then sufficiently dried using a dryer to optimize it for a subsequent copper sputtering process.

In the step 3), the surface modified polyimide film is sputtered by bombardment with copper to form a copper foil.

The sputtering process of the present invention is conducted using the pulse DC sputtering device 20 depicted in FIG. 15. The polyimide film 13 modified in the previous step is wound on rollers 14, and argon gas is supplied in an amount of 5~30 sccm into a vacuum chamber 12 maintained at 1× $10^{-3}$~1×$10^{-5}$ torr through an inlet 11 thereof to form a sputtering atmosphere. Thereafter, while current of 0.5~30 mA and power of 50~500 W are maintained, copper sputtering is conducted for 1~10 hours, thus forming a copper sputtering layer having a thickness of 500~5,000 Å. If the copper sputtering layer is thinner than 500 Å, pinholes may be formed, or current will not flow upon electroplating. Further, this layer may peel due to its low plating adhesion. On the other hand, if the copper sputtering layer is thicker than 5,000 Å, energy loss is large and the layer is too thick to be suitable for use as a substrate.

In the step 4), the polyimide film having the copper sputtering layer is loaded into an electroplating bath including copper sulfate and an aqueous sulfuric acid solution, and thus a thin copper electroplating layer is formed on the thin copper sputtering layer of the polyimide film, thereby manufacturing the FCCL. As such, the copper foil preferably has a thickness of 1~50 μm. When the copper electroplating layer is thinner than 1 μm, the FCCL may have pinholes formed therein and be difficult to handle. On the other hand, when the copper foil is thicker than 50 μm, the line/space accuracy of highly dense wires may be decreased. Further, part mounting ability is undesirably reduced in terms of light weight and miniaturization.

In addition, the present invention provides a two-layered polyimide FCCL manufactured using the manufacturing method mentioned above.

The two-layered polyimide FCCL of the present invention is comprising a 500~5,000 Å thick copper sputtering layer on either surface of the polyimide film modified using the surface modification method of the present invention and a 1~50 μm thick copper electroplating layer on the copper sputtering layer.

Moreover, both surfaces of the polyimide film modified using the surface modification method of the present invention may be subjected to the above processes, thereby providing a double-sided polyimide FCCL having a two-layer structure.

The polyimide FCCL of the present invention has adhesive strength of 0.7 kg/cm or more between the polyimide film and the copper foil.

The FCCL having a two-layer structure of the present invention can be applied to processes of forming a copper circuit pattern by forming a mask having a predetermined pattern and then selectively etching the exposed copper foil using a copper etchant to remove it, and is therefore suitable for use in material for a substrate for electronic parts, such as a flexible printed circuit board, TCP (Tape Carrier Package), COF (Chip On Film), etc.

Mode For The Invention

Hereinafter, the present invention is specifically explained using the following examples which are set forth to illustrate, but are not to be construed to limit the present invention.

EXAMPLE 1

Step 1: Preparation of Ethyleneimine-Based Silane Coupling Agent Composition 1 mol of Aziridine, as the compound of Formula 1 was reacted with 1 mol of tetramethyl orthosilicate, as the compound of Formula 2 at 80° C. for 96 hours. After the reaction, undesirably produced methanol was removed through heating, thus preparing an ethyleneimine-based silane coupling agent.

Step 2: Preparation of Polyimide FCCL

A polyimide film (Kapton E, Dupont) was loaded into the chamber of a plasma device and then surface treated for 150 sec using plasma generated at a current of 6 mA and voltage of 1 KV under pressure of $3\times10^4$ torr in an argon atmosphere.

The ethyleneimine-based silane coupling agent prepared in Step 1 was dissolved to 0.1 wt % in a solvent mixture comprising water and methanol mixed at 1:1, to prepare a dipping solution, into which the surface treated polyimide film was then dipped for 10 min and subsequently reacted in an oven at 100° C. for 60 minutes. Thereafter, the resultant film was washed with methanol and dried in an oven.

The dried film was loaded into the plasma chamber and then subjected to second plasma treatment for 600 sec using plasma generated at 1 KV and 6 mA under $5\times10^{-4}$ torr in an argon atmosphere. Subsequently, the film was loaded into a sputtering device and then sputtered at 3.5 mA and 200 W for 1 hour in a vacuum of $4\times10^{-3}$ torr while controlling the pressure using argon gas. The resultant copper foil had a uniform thickness of 2,500 Å. Then, electroplating was conducted in an electroplating bath to form a 20 μm thick copper electroplating layer, thereby manufacturing a polyimide FCCL.

EXAMPLE 2

Upon the preparation of the ethyleneimine-based silane coupling agent of Step 1 of Example 1, 1 mol of aziridine ethanol was reacted with tetramethyl orthosilicate having the molar ratio shown in Table 1 below, to prepare an ethyleneimine-based silane coupling agent. The ethyleneimine-based silane coupling agent thus prepared was dissolved to 0.5 wt % in a solvent mixture comprising water and methanol mixed at 1:1, to prepare a dipping solution. Subsequently, a surface treated polyimide film (Kapton E, Dupont) as in Step 2 of Example 1 was dipped into the solution for 10 min, allowed to react in an oven at 100° C. for 1 hour, washed with distilled water, and then dried. Thereafter, the resultant film was subjected to second plasma treatment under conditions the same as in Example 1, after which copper was formed on the modified polyimide film to a thickness of 3,000 Å through sputtering, followed by conducting electroplating, thus manufacturing a 45 μm thick polyimide FCCL.

EXAMPLE 3

A 45 μm thick polyimide FCCL was manufactured in the same manner as in Example 1, with the exception that an ethyleneimine-based silane coupling agent, prepared by reacting 1 mol of aziridine ethanol with tetramethyl orthosilicate having the molar ratio shown in Table 1 below, was used, instead of the ethyleneimine-based silane coupling agent of Step 1 of Example 1.

EXAMPLE 4

A 20 μm thick polyimide FCCL was manufactured in the same manner as in Example 3, with the exception that an ethyleneimine-based silane coupling agent, prepared by reacting 1 mol of aziridine ethanol with tetramethyl orthosilicate having the molar ratio shown in Table 1 below, instead of instead of the ethyleneimine-based silane coupling agent of Step 1 of Example 1, was used, and such a coupling agent was dissolved to 0.1 wt % in a solvent mixture comprising water and methanol mixed at 1:1 to prepare a dipping solution.

EXAMPLE 5

A 45 μm thick polyimide FCCL was manufactured in the same manner as in Example 1, with the exception that a Upilex-S film (Ube, Japan) was used instead of the polyimide film of Step 1 of Example 1.

TABLE 1

| Preparation of Ethyleneimine-based Silane Coupling Agent | | | |
| --- | --- | --- | --- |
| No. | Formula 1 | Formula 2 | Polyimide Film |
| Ex.. 1 | Aziridine Ethanol | Tetramethyl Orthosilicate (1 mol) | Kapton - E |
| Ex.. 2 | Aziridine Ethanol | Tetramethyl Orthosilicate (0.5 mol) | Kapton - E |
| Ex.. 3 | Aziridine Ethanol | Tetramethyl Orthosilicate (0.25 mol) | Kapton - E |
| Ex.. 4 | Aziridine Ethanol | Tetramethyl Orthosilicate (0.5 mol) | Kapton - E |
| Ex.. 5 | Aziridine Ethanol | Tetramethyl Orthosilicate (1 mol) | Upilex-S |

COMPARATIVE EXAMPLE 1

A polyimide film (Kapton E, Dupont) was copper sputtered and electroplated in the same manner as in Example 1, with the omission of a surface modification process including first plasma treatment, reaction with a coupling agent and second plasma treatment, thus manufacturing a 20 μm thick polyimide FCCL.

COMPARATIVE EXAMPLE 2

A polyimide film (Kapton E, Dupont) was subjected to first plasma treatment in the same manner as in Example 1, with the omission of surface modification using a coupling agent and subsequent second plasma treatment, and was then copper sputtered and electroplated in the same manner as in Example 1, thus manufacturing a 20 μm thick polyimide FCCL.

COMPARATIVE EXAMPLE 3

A polyimide film (Kapton E, Dupont) was subjected to first plasma treatment in the same manner as in Example 1 and then to surface modification using the ethyleneimine-based silane coupling agent used in Example 1, with the omission of second plasma treatment, after which it was copper sputtered and electroplated in the same manner as in Example 1, thus manufacturing a 20 μm thick polyimide FCCL.

COMPARATIVE EXAMPLE 4

A polyimide film (Kapton E, Dupont) was subjected to first plasma treatment in the same manner as in Example 1 and then to surface modification using the ethyleneimine-based silane coupling agent used in Example 3, with the omission of second plasma treatment, after which it was copper sputtered and electroplated in the same manner as in Example 1, thus manufacturing a 20 μm thick polyimide FCCL.

EXPERIMENTAL EXAMPLE 1

Measurement of Adhesive Strength

The properties of the polyimide FCCLs manufactured in Examples 1~5 and Comparative Examples 1~4 were measured as follows.

The surface of each of the FCCLs electroplated in Examples 1~5 and Comparative Examples 1~4 was patterned using acid resistant paint or acid resistant tape, and was then etched using an etchant comprising sulfuric acid or copper sulfate, after which the 90° peel strength thereof was measured. The results of contact angle and adhesive strength are given in Tables 2 and 3, below.

TABLE 2

| Results of Measurement of Contact Angle | |
| --- | --- |
| No. | Contact Angle |
| C. Ex. 1 | 67.7 |
| C. Ex. 2 | 31.9 |
| C. Ex. 3 | 63.1 |
| Ex. 1 | 16.9 |
| Ex. 2 | 17.2 |

TABLE 3

Results of Measurement of Adhesive Strength

| No. | First Plasma Treatment | Treatment with Coupling Agent | Second Plasma Treatment | Adhesive Strength (kg/cm) |
|---|---|---|---|---|
| Ex. 1 | Yes | Yes | Yes | 0.74 |
| Ex. 2 | Yes | Yes | Yes | 0.71 |
| Ex. 3 | Yes | Yes | Yes | 0.67 |
| Ex. 4 | Yes | Yes | Yes | 0.68 |
| Ex. 5 | Yes | Yes | Yes | 0.72 |
| C. Ex. 1 | No | No | No | 0.20 |
| C. Ex. 2 | Yes | No | No | 0.53 |
| C. Ex. 3 | Yes | Yes | No | 0.43 |
| C. Ex. 4 | Yes | Yes | No | 0.41 |

As is apparent from Tables 2 and 3, the polyimide FCCLs manufactured through the surface modification process of the present invention had adhesive strength of 0.67 kg/cm or more between the polyimide film and copper.

EXPERIMENTAL EXAMPLE 2

Measurement of Atomic Ratio on Polyimide

The surface of each of the polyimide FCCLs manufactured in Examples 1~5 and Comparative Examples 1~4 was analyzed through ESCA to evaluate the atomic ratio.

The results of atomic ratio analysis of the polyimide FCCL manufactured through the first plasma treatment, treatment with a coupling agent and second plasma treatment in Example 1 were compared to those of the FCCL manufactured without surface modification in Comparative Example 1 and of the FCCL manufactured through only the first plasma treatment in Comparative Example 2. The results are given in Table 4 below and FIGS. 10 and 13.

TABLE 4

Results of Measurement of Atomic Ratio on Polyimide Film

| | Surface Atoms of Polyimide | | | |
|---|---|---|---|---|
| No. | C1s | O1s | N1s | Si2p |
| C. Ex. 1 | 78.33% | 13.38% | 8.01 | 0.27 |
| C. Ex. 2 | 68.81% | 20.22% | 7.35 | 0.22 |
| C. Ex. 3 | 55.45% | 29.92% | 8.16 | 6.46 |
| Ex. 1 | 76.73% | 16.40% | 6.10 | 0.77 |

From the results, the polyimide film surface modified using the ethyleneimine-based silane coupling agent in Comparative Example 3 could be seen to have a silicon atom and a high oxygen content, thus realizing the polarized polyimide surface. The polyimide film of Example 1 showed oxygen and silicon contents higher than those of the polyimide film of Comparative Example 1. Further, since the polyimide film of Example 1 had molecular recombination occurring thereon depending on the plasma conditions, it exhibited better adhesion despite having less oxygen, nitrogen and silicon than the polyimide film of Comparative Example 3.

Industrial Applicability

As previously described herein, according to the present invention, first, the method of surface modifying a polyimide film of the present invention is conducted by modifying the surface of a polyimide film through first plasma treatment, dipping the polyimide film into a solution containing an ethyleneimine-based silane coupling agent, and then modifying the surface of the polyimide film through second plasma treatment. Thus, the method of surface modifying a polyimide film is advantageous because it may be substituted for a conventional surface treatment processes using ion beams, without the need of a specific seed layer, therefore decreasing the cost and reducing environmental contamination due to the use of heavy metals.

Further, a polyimide FCCL having a two-layer structure is provided, and, in particular, a single-sided or double-sided polyimide FCCL having a two-layer structure can be provided by modifying either or both surfaces of the polyimide film.

Furthermore, the two-layered FCCL has good adhesive strength between the polyimide film and a copper foil and can maintain such adhesive strength even at high temperatures for a long period of time, and thus can be usefully applied to substrate materials of electronic parts, such as flexible printed circuit board, TCP or COF.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

We claim:

1. A method of manufacturing a flexible copper clad laminate having a two-layered structure and having an adhesive strength of at least 0.67 kg/cm or more, said method comprising the steps of:

modifying the surface of a polyimide film by first-treating with plasma to supply a hydrophilic group to the surface thereof, dipping into a solution containing an ethyleneimine-based silane coupling agent which is prepared by mixing a compound represented by Formula 1 and a compound represented by Formula 2 with a molar ratio of 1:0.25~1, for surface treatment to induce a graft reaction, and then modifying the surface of the polyimide film by second-treating with plasma to affect molecular recombination on the film;

washing and drying the surface modified polyimide film;

copper-sputtering either or both surfaces of the dried polyimide film at 0.5~30 mA and 50~500 W for 1~10 hours to form a copper sputtering layer; and electroplating the copper sputtering layer to form a copper electroplating layer, wherein Formula 1 is

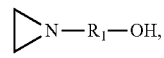

and Formula 2 is

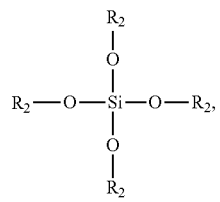

and wherein, $R_1$ and $R_2$ are each selected from the group consisting of hydrogen, a $C_1$~$C_{10}$ alkyl group, and a vinyl group.

2. The method according to claim 1, wherein the copper sputtering layer has a thickness of 500~5,000Å.

3. The method according to claim 1, wherein the copper electroplating layer has a thickness of 1~50 μm.

4. A method of manufacturing a flexible copper clad laminate having a two-layered structure of polyimide film and a copper electroplating layer having an adhesive strength of at least 0.67 kg/cm or more, said method comprising the steps of:

- modifying the surface of said polyimide film by first treating the surface of the polyimide film with plasma to supply a hydrophilic group to the surface of the polyimide film, dipping into a solution containing ethylene-imine-based silane coupling agent which is prepared by mixing a compound represented by Formula 1 and a compound represented by Formula 2 with a molar ratio of 1:0.25~1, for treating the surface of the polyimide film to induce a graft reaction, and then modifying the surface of said polyimide film by second-treating with plasma to affect molecular recombination on the film to create a modified polyimide film having a pair of surfaces;
- washing and drying the surface modified polyimide film to prepare at least one surface of dried polyimide film;
- copper-sputtering either or both surfaces of the dried polyimide film at 0.5~30 mA and 50~500 W for 1~10 hours to form a copper sputtering layer; and
- electroplating the copper sputtering layer to form a copper electroplating layer;

wherein Formula 1 is

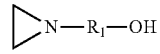

and Formula 2 is

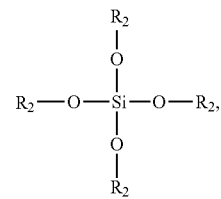

and wherein $R_1$ and $R_2$ are each selected from the group consisting of hydrogen, a $C_1$~$C_{10}$ alkyl group, and a vinyl group.

* * * * *